United States Patent
Ota

(10) Patent No.: US 8,355,067 B2
(45) Date of Patent: Jan. 15, 2013

(54) SOLID STATE IMAGING DEVICE AND IMAGING APPARATUS

(75) Inventor: Motoari Ota, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 722 days.

(21) Appl. No.: 12/333,018

(22) Filed: Dec. 11, 2008

(65) Prior Publication Data

US 2009/0153716 A1 Jun. 18, 2009

(30) Foreign Application Priority Data

Dec. 13, 2007 (JP) ................ P2007-322069

(51) Int. Cl.
*H04N 3/14* (2006.01)
*H04N 5/335* (2011.01)

(52) U.S. Cl. ........................................ 348/308
(58) Field of Classification Search .......... 348/308
See application file for complete search history.

(56) References Cited

U.S. PATENT DOCUMENTS

| | | | |
|---|---|---|---|
| 4,839,735 A | 6/1989 | Kyomasu et al. | |
| 6,667,768 B1 * | 12/2003 | Fossum | 348/308 |
| 6,850,278 B1 * | 2/2005 | Sakurai et al. | 348/302 |
| 7,271,835 B2 * | 9/2007 | Iizuka et al. | 348/314 |
| 7,511,275 B2 * | 3/2009 | Mabuchi | 250/340 |
| 7,719,037 B2 * | 5/2010 | Haraguchi | 257/239 |
| 7,952,635 B2 * | 5/2011 | Lauxtermann | 348/308 |
| 2004/0041077 A1 * | 3/2004 | Fossum | 250/208.1 |
| 2005/0206766 A1 * | 9/2005 | Suzuki | 348/308 |
| 2006/0092299 A1 | 5/2006 | Suzuki | |
| 2006/0284051 A1 | 12/2006 | Ko et al. | |

FOREIGN PATENT DOCUMENTS

| | | |
|---|---|---|
| JP | 63-254765 A | 10/1988 |
| JP | 2005-268477 A | 9/2005 |
| JP | 2006-120921 A | 5/2006 |
| JP | 2007-006478 A | 1/2007 |

* cited by examiner

*Primary Examiner* — Chieh M Fan
*Assistant Examiner* — Fayez Bhuiyan
(74) *Attorney, Agent, or Firm* — Birch, Stewart, Kolasch & Birch, LLP

(57) ABSTRACT

A solid state imaging device is provided and includes: a semiconductor substrate a photoelectric conversion element including a pair of electrodes and a photoelectric conversion layer sandwiched between the pair of electrodes; a signal output circuit including an MOS transistor for outputting a signal responsive to an electric charge generated by the photoelectric conversion layer; a first electric charge storage section which is provided in the semiconductor substrate and in which the electric charge generated by the photoelectric conversion layer is directly stored; a second electric charge storage section provided in the semiconductor substrate and connected to a gate of an output transistor in the signal output circuit; and an electric charge transfer section that transfers the electric charge, stored in the first electric charge storage section, to the second electric charge storage section.

5 Claims, 14 Drawing Sheets

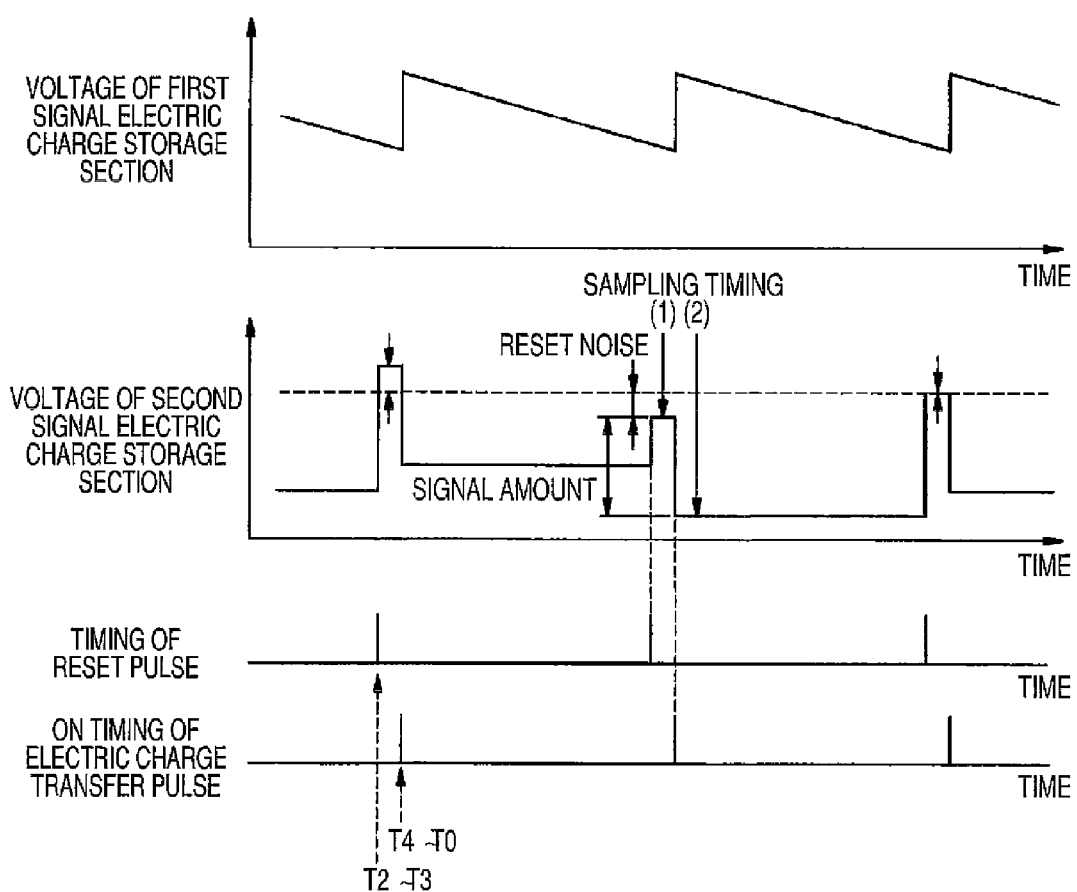

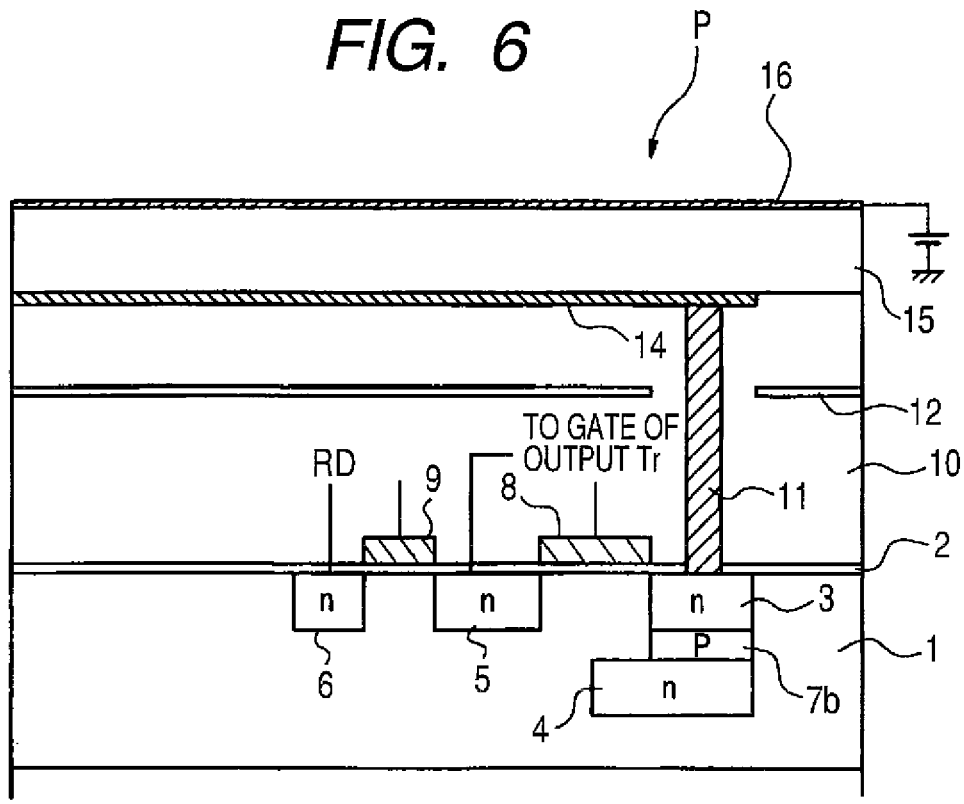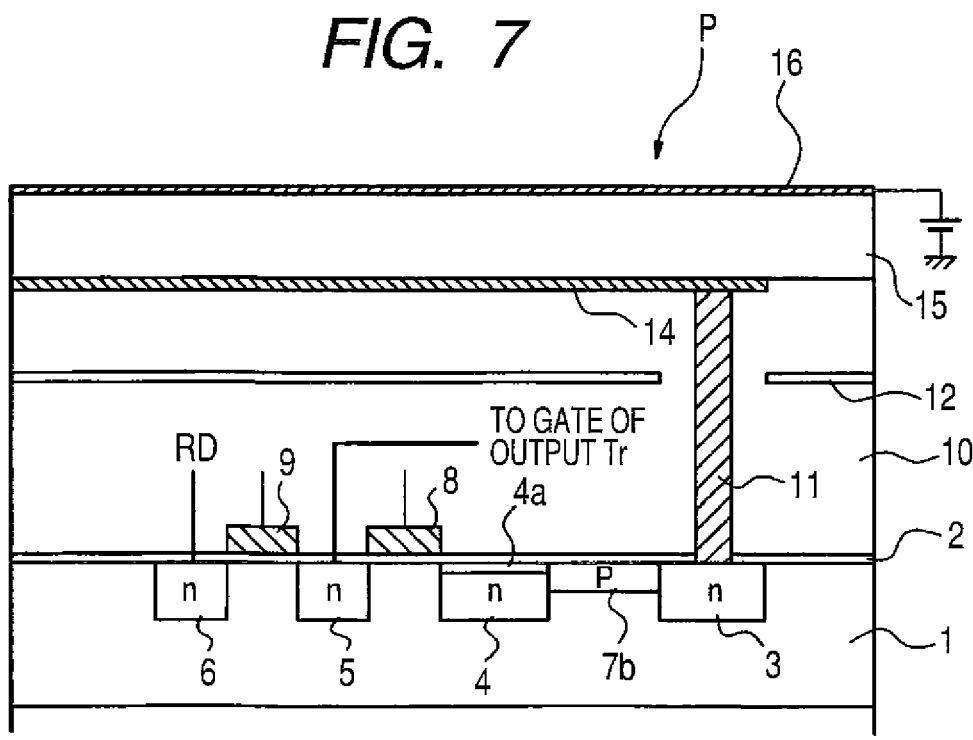

SOLID STATE IMAGING DEVICE AND IMAGING APPARATUS

This application is based on and claims priority under 35 U.S.C. §119 from Japanese Patent Application No. 2007-322069 filed Dec. 13, 2007, the entire disclosure of which is herein incorporated by reference.

BACKGROUND OF THE INVENTION

1. Field of the Invention

The present invention relates to a solid state imaging device including: a photoelectric conversion element including a pair of electrodes stacked over a semiconductor substrate and a photoelectric conversion layer sandwiched between the electrodes; and a signal output circuit for outputting a signal responsive to an electric charge generated by the photoelectric conversion layer.

2. Description of Related Art

JP-A-2005-268477 discloses a solid state imaging device including: a semiconductor substrate on which a signal reading circuit including an MOS transistor circuit is formed; a photoelectric conversion film which is stacked over the semiconductor substrate, and through which a signal electric charge responsive to an incident light amount is generated; a connection section which is provided at a surface of the semiconductor substrate, and to which wiring for guiding the signal electric charge to the surface of the semiconductor substrate is connected; a potential barrier means which is provided so as to be adjacent to the connection section, and serves as a constant potential barrier for an electric charge of the connection section; and an electric charge storage section which is provided so as to be adjacent to the potential barrier means, and is connected to a gate of an output transistor constituting the signal reading circuit.

In such a structure, a photoelectric charge generated by the photoelectric conversion film is allowed to smoothly flow to the gate of the output transistor, and in terms of the gate of the output transistor, an effective capacitance of a signal electric charge storing section is reduced, and a signal voltage is increased, thus making it possible to obtain a high-sensitivity output signal.

FIG. 17 is a diagram for describing how the solid state imaging device disclosed in JP-A-2005-268477 operates, in which there is shown a cross-sectional potential within a semiconductor substrate.

In order to obtain a signal from one pixel of the solid state imaging device, first, an electric charge stored in the electric charge storage section is discharged to a reset drain to trigger a reset (time T0). At this time, as shown in the diagram, a reset noise N1, which is a noise electric charge generated with a reset operation, is stored in the electric charge storage section. Upon completion of the reset, the light exposure of the photoelectric conversion film is started, and a signal electric charge Q, generated by this light exposure, is allowed to go through the potential barrier from the connection section, and is stored in the electric charge storage section (time T1). Then, a signal, responsive to an electric charge amount stored in the electric charge storage section during this light exposure period, is outputted from the signal reading circuit. After the signal has been outputted, a reset operation is performed again as indicated by a time T2, a reset noise N2 is stored in the electric charge storage section, and the next light exposure is started in this state.

A signal processing circuit for processing a signal outputted from the solid state imaging device includes a correlated double sampling (CDS) circuit for performing a correlated double sampling process on the signal. In this CDS circuit, sampling is performed on two types of signals, i.e., a signal responsive to a reset noise and a signal responsive to a signal electric charge including the reset noise, and a difference between both the signals is determined, thus removing the reset noise.

A signal responsive to the reset noise N1, which has been obtained at the time T0, is subtracted from an imaging signal obtained at the time T1, thereby making it possible to completely remove the reset noise. In order to perform such a process, it is necessary for the CDS circuit to perform sampling on a signal outputted from the solid state imaging device at the time T0 (sampling SP1), and sampling on a signal outputted from the solid state imaging device at the time T1 (sampling SP2) to determine a difference between both the signals. However, the time period from the sampling SP1 to the sampling SP2 is identical to the light exposure period, and the CDS circuit has to sequentially process signals from all pixels; therefore, if the signal sampling is performed at such a time interval, it becomes impossible for the processing to keep up with the signals outputted from the solid state imaging device.

Therefore, a signal subjected to sampling (sampling SP3) at the time T2 has conventionally been subtracted from a signal subjected to sampling at the time T1, thus removing the reset noise. Since the time interval between the sampling SP2 and the sampling SP3 is sufficiently shorter compared with the light exposure period, a CDS process can be performed on signals from all pixels without problems.

However, the reset noise generated by a reset operation is not constant but is varied; therefore, the reset noise cannot be properly removed by performing a process of subtracting the reset noise, generated by the reset operation at the time T2, from the signal including the reset noise generated by the reset operation at the time T0.

SUMMARY OF THE INVENTION

An object of the invention is to provide a solid state imaging device capable of properly removing a reset noise.

According to an aspect of the invention, there is provided a solid state imaging device including: a photoelectric conversion element including a pair of electrodes stacked over a semiconductor substrate and a photoelectric conversion layer sandwiched between the electrodes; and a signal output circuit including an MOS transistor for outputting a signal responsive to an electric charge generated by the photoelectric conversion layer. The solid state imaging device further includes: a first electric charge storage section which is provided in the semiconductor substrate and in which the electric charge generated by the photoelectric conversion layer is directly stored; a second electric charge storage section provided in the semiconductor substrate and connected to a gate of an output transistor constituting the signal output circuit; and electric charge transfer means for transferring the electric charge, stored in the first electric charge storage section, to the second electric charge storage section.

The solid state imaging device may include: a connection section provided in the semiconductor substrate and electrically connected to one of the pair of electrodes; and potential barrier means provided so as to be adjacent to the connection section and serving as a constant potential barrier for the connection section, wherein the first electric charge storage section is provided so as to be adjacent to the potential barrier means.

In the solid state imaging device, the potential barrier means may be an impurity layer having a conductivity type opposite to those of the connection section, the first electric charge storage section, and the second electric charge storage section.

In the solid state imaging device of the present invention, the potential barrier means may be provided under the connection section, and the first electric charge storage section may be provided under the potential barrier means.

In the solid state imaging device, the potential barrier means may be a gate electrode of a transistor whose source is the connection section and whose drain is the first electric charge storage section.

In the solid state imaging device an impurity layer having a conductivity type opposite to that of the first electric charge storage section may be provided at a surface of the first electric charge storage section.

In the solid state imaging device, the electric charge transfer means may be a gate electrode of a transistor whose source is the first electric charge storage section and whose drain is the second electric charge storage section.

The solid state imaging device may include: a third electric charge storage section provided in the semiconductor substrate so as to be adjacent to the second electric charge storage section; and combination control means for performing control so as to combine a storage capacity of the second electric charge storage section with that of the third electric charge storage section.

In the solid state imaging device, the combination control means may be a gate electrode of a transistor whose source is the second electric charge storage section and whose drain is the third electric charge storage section.

In the solid state imaging device, an impurity layer having a conductivity type opposite to that of the third electric charge storage section may be provided at a surface of the third electric charge storage section.

In the solid state imaging device, the storage capacity of the second electric charge storage section may be smaller than that of the first electric charge storage section.

In the solid state imaging device, the signal output circuit may include: a first reset transistor for resetting an electric charge stored in the second electric charge storage section; and a second reset transistor for resetting an electric charge stored in the third electric charge storage section.

According to an aspect of the invention, there is provided an imaging apparatus including the above-described solid state imaging device, wherein the signal output circuit of the solid state imaging device includes a reset transistor for resetting an electric charge of the second electric charge storage section, and wherein the imaging apparatus includes: driving means for performing, after the electric charge of the second electric charge storage section has been reset by the reset transistor, driving so as to transfer the electric charge stored in the first electric charge storage section to the second electric charge storage section that has been reset; and signal processing means for performing sampling on a noise signal responsive to a noise electric charge stored in the second electric charge storage section by the reset, and on an imaging signal responsive to the electric charge transferred to the second electric charge storage section after the reset, and for determining a difference between both the signals, thereby performing a correlated double sampling process for removing the noise signal from the imaging signal.

According to an aspect of the invention, there is provided an imaging apparatus including the above-described solid state imaging device, the imaging apparatus including driving means, wherein when the amount of an electric charge generated by the photoelectric conversion layer is equal to or less than a threshold value, the driving means performs driving to allow the electric charge to be transferred from the first electric charge storage section to the second electric charge storage section without combining the storage capacity of the second electric charge storage section with that of the third electric charge storage section, thereby allowing output of a signal responsive to the electric charge transferred to the second electric charge storage section, and wherein when the amount of an electric charge generated by the photoelectric conversion layer is greater than the threshold value, the driving means performs driving to allow the electric charge to be transferred from the first electric charge storage section to the second electric charge storage section after having combined the storage capacity of the second electric charge storage section with that of the third electric charge storage section, thereby allowing output of a signal responsive to the electric charge transferred to the second electric charge storage section and the third electric charge storage section.

BRIEF DESCRIPTION OF THE DRAWINGS

The features of the invention will appear more fully upon consideration of the exemplary embodiments of the inventions, which are schematically set forth in the drawings, in which:

FIG. 5 is a diagram showing relationships among the voltage change of a first electric charge storage section, the voltage change of a second electric charge storage section, the reset timing of a reset transistor, and the timing of transfer of an electric charge from the first electric charge storage section to the second electric charge storage section in the solid state imaging device of the first embodiment;

FIG. 6 is a schematic cross-sectional view of a solid state imaging device for one pixel, serving as a second exemplary embodiment of the present invention;

FIG. 7 is a schematic cross-sectional view of a solid state imaging device for one pixel, serving as a third exemplary embodiment of the present invention;

DETAILED DESCRIPTION OF THE EXEMPLARY EMBODIMENTS

According to an exemplary embodiment of the present invention, it is possible to provide a solid state imaging device capable of properly removing a reset noise.

Hereinafter, exemplary embodiments of the present invention will be described with reference to the drawings.

<First Embodiment>

Figure 1:
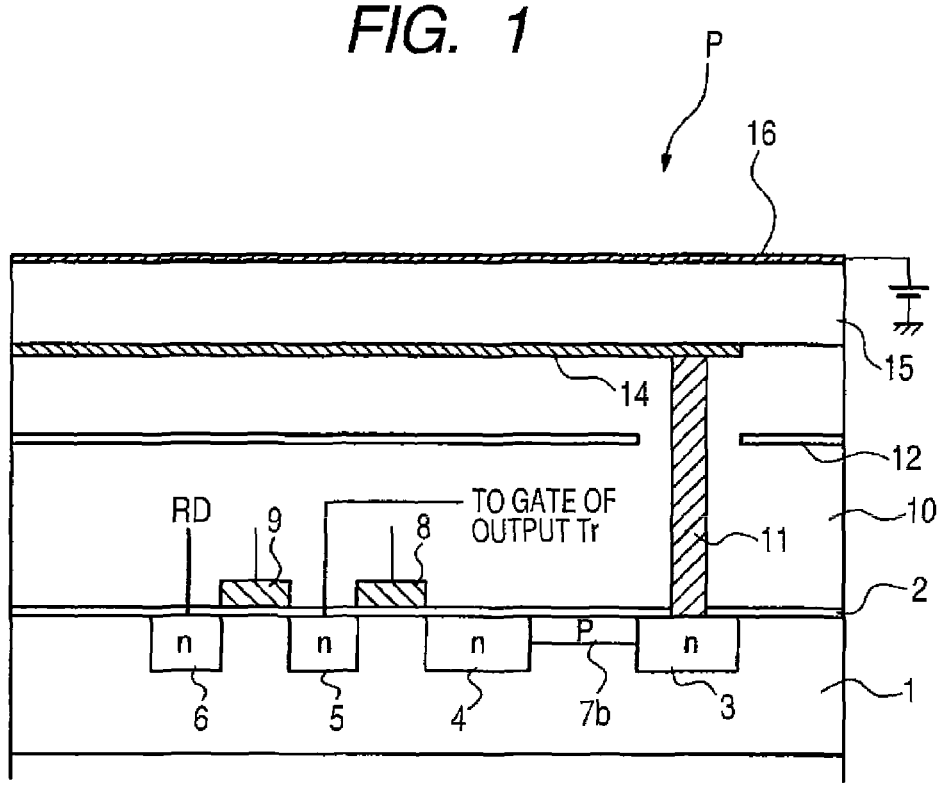
FIG. 1 is a schematic cross-sectional view of a solid state imaging device for one pixel, serving as a first exemplary embodiment of the present invention.

FIG. 1 is a schematic cross-sectional view of a solid state imaging device for one pixel, serving as a first exemplary embodiment of the present invention. The solid state imaging device of the present embodiment has a structure in which one pixel shown in FIG. 1 is two-dimensionally arranged on the same plane.

The solid state imaging device shown in FIG. 1 includes: a p-type silicon substrate 1 (hereinafter, called a "substrate 1") serving as a semiconductor substrate; and a photoelectric conversion element P stacked over the substrate 1 via a gate insulating film 2 and an insulating layer 10.

The photoelectric conversion element P is structured to include: a lower electrode 14 formed on the insulating layer 10; a photoelectric conversion layer 15 formed on the lower electrode 14; and an upper electrode 16 formed on the photoelectric conversion layer 15.

Incident light from an object is incident upon the upper electrode 16 from thereabove. Since the upper electrode 16 needs to allow the incident light to be incident upon the photoelectric conversion layer 15, the upper electrode 16 is made of a conductive material that is transparent with respect to the incident light. The upper electrode 16 is formed into a single sheet common to all pixels, but may be divided for each pixel.

The lower electrode 14 is a thin film divided for each pixel, and is made of a transparent or opaque conductive material.

The photoelectric conversion layer 15 is a layer made of an organic or inorganic photoelectric conversion material that absorbs a specific wavelength region of the incident light to generate a signal electric charge responsive to the quantity of the light absorbed. Monochrome imaging is enabled by forming the photoelectric conversion layer 15 by a photoelectric conversion material (e.g., quinacridon) that absorbs light in a green wavelength region to generate a signal electric charge responsive to the absorbed light. Infrared imaging is enabled by forming the photoelectric conversion layer 15 by a photoelectric conversion material (e.g., a phthalocyanine organic material or a naphthalocyanine organic material) that absorbs light in an infrared wavelength region to generate a signal electric charge responsive to the absorbed light.

In the substrate 1, there is provided a connection section 3 made of an n-type impurity layer electrically connected to the lower electrode 14. The connection section 3 and the lower electrode 14 are connected to each other via a contact wiring 11 made of a conductive material embedded within the gate insulating film 2 and the insulating layer 10.

Next to the connection section 3, there is provided a p-type impurity layer 7b having a conductivity type opposite to that of the connection section 3. The p-type impurity layer 7b functions as a potential barrier means that becomes a constant potential barrier for the connection section 3.

Next to the p-type impurity layer 7b, there is provided a first electric charge storage section 4 for storing a signal electric charge that has reached the connection section 3 from the contact wiring 11 and moved from there through the p-type impurity layer 7b. The first electric charge storage section 4 is formed by an n-type impurity layer having a conductivity type similar to that of the connection section 3.

Next to the first electric charge storage section 4, a second electric charge storage section 5 is provided at a slight distance therefrom. The second electric charge storage section 5 is formed by an n-type impurity layer having a conductivity type similar to that of the connection section 3.

Above the substrate 1 between the first electric charge storage section 4 and the second electric charge storage section 5, a gate electrode 8 of a transistor, whose source is the first electric charge storage section 4 and whose drain is the second electric charge storage section 5, is provided via the gate insulating film 2. This gate electrode 8 functions as an electric charge transfer means for transferring the electric charge, stored in the first electric charge storage section 4, to the second electric charge storage section 5. Hereinafter, the gate electrode 8 will be called an "electric charge transfer gate 8". Upon application of a high-voltage electric charge transfer pulse to this electric charge transfer gate 8, the electric charge stored in the first electric charge storage section 4 is transferred to the second electric charge storage section 5.

Next to the second electric charge storage section 5, a reset drain 6, formed by an n-type impurity layer having a conductivity type similar to that of the connection section 3, is provided at a slight distance therefrom. Above the substrate 1 between the second electric charge storage section 5 and the reset drain 6, a gate electrode (hereinafter, called a "reset gate") 9 of a reset transistor, whose source is the second electric charge storage section 5 and whose drain is the reset drain 6, is provided via the gate insulating film 2. Upon application of a high-voltage reset pulse to the reset gate 9, the electric charge stored in the second electric charge storage section 5 is discharged to the reset drain 6.

The substrate 1 is further provided, for each pixel, with a signal output circuit including an MOS transistor for outputting a signal responsive to the electric charge stored in the second electric charge storage section 5. This signal output circuit also includes the above-mentioned reset transistor.

Figure 2:
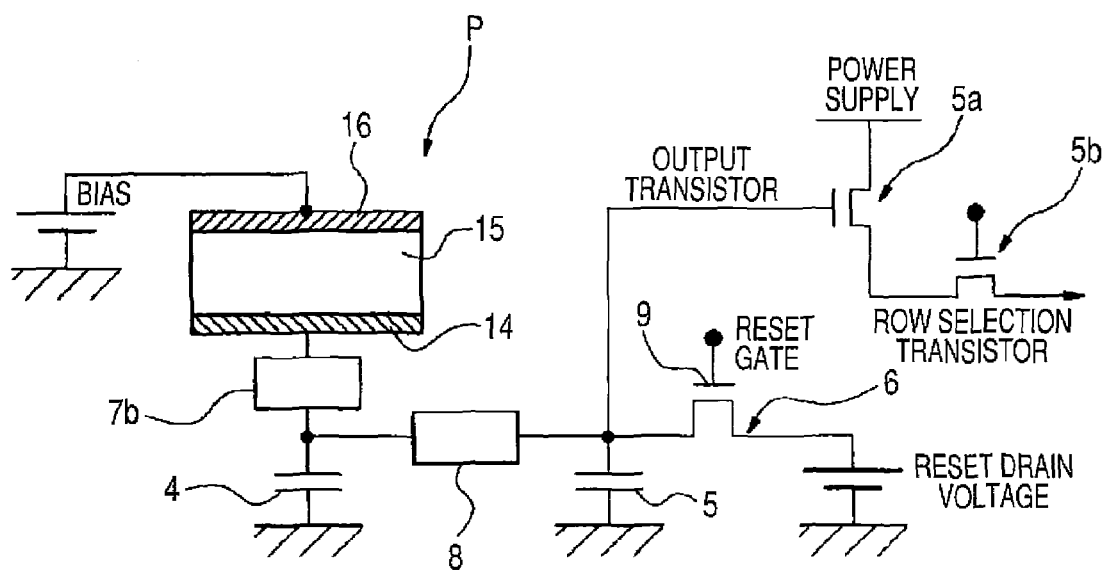
FIG. 2 is a diagram showing an equivalent circuit for one pixel shown in FIG. 1.

FIG. 2 is a diagram showing an equivalent circuit for one pixel shown in FIG. 1.

As shown in FIG. 2, in addition to the reset transistor, the signal output circuit includes an output transistor 5a and a row selection transistor 5b. The output transistor 5a is connected at its gate to the second electric charge storage section 5, connected at its source to a power supply, and connected at its drain to the source of the row selection transistor 5b. The output transistor 5a outputs a voltage signal responsive to the amount of electric charges stored in the second electric charge storage section 5.

Upon application of a row selection pulse to the gate of the row selection transistor 5b, the row selection transistor 5b outputs the voltage signal, outputted from the output transistor 5a, to a signal line. By sequentially applying, on a row-by-row basis, a row selection pulse to the signal output circuits provided for respective pixels, signals are outputted from all pixels.

Figure 3:
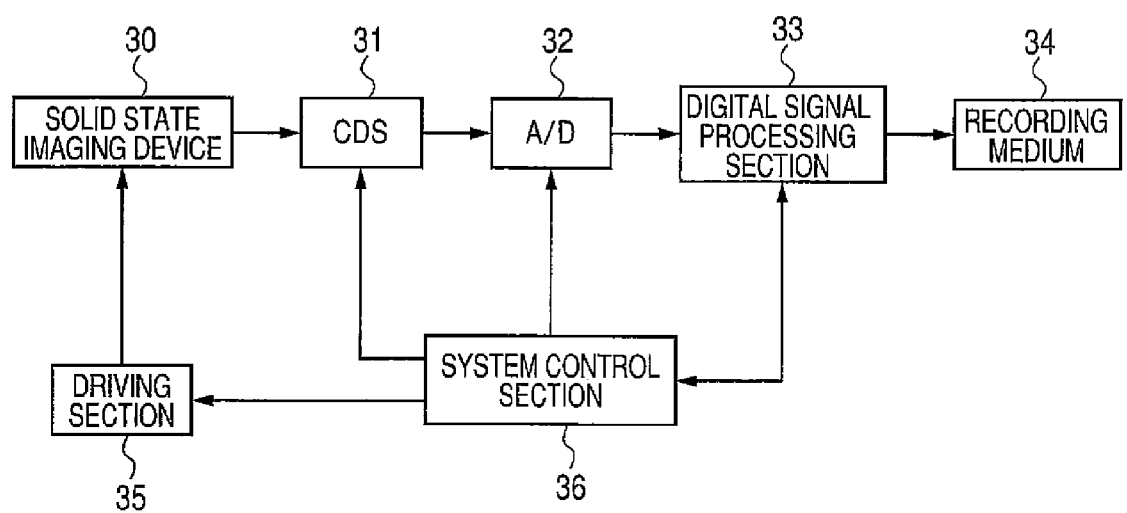
FIG. 3 is a diagram showing a configuration example of an imaging apparatus equipped with the solid state imaging device of the first embodiment.

FIG. 3 is a diagram showing a configuration example of an imaging apparatus equipped with the solid state imaging device of the first embodiment.

The imaging apparatus shown in FIG. 3 includes: a solid state imaging device 30 in which the pixel shown in FIG. 1 is arranged in an array; a CDS circuit 31 for performing a correlated double sampling (CDS) process on a signal obtained from each pixel of the solid state imaging device, thereby removing a reset noise; an A/D converter 32 for converting an output signal of the CDS circuit 31 to a digital signal; a digital signal processing section 33 for performing predetermined digital signal processing on the digital signal outputted from the A/D converter 32, thereby generating image data; a recording medium 34 on which the image data generated by the digital signal processing section 33 is recorded; a driving section 35 for driving the solid state imaging device 30; and a system control section 36 for performing centralized control of the entire imaging apparatus.

The driving section 35 performs, for example, the control of application of a reset pulse to the reset gate 9, the control of application of an electric charge transfer pulse to the electric charge transfer gate 8, and the control of application of a row selection pulse to the row selection transistor 5b.

Hereinafter, how the imaging apparatus configured as described above operates during moving image shooting will be described.

Figure 4:
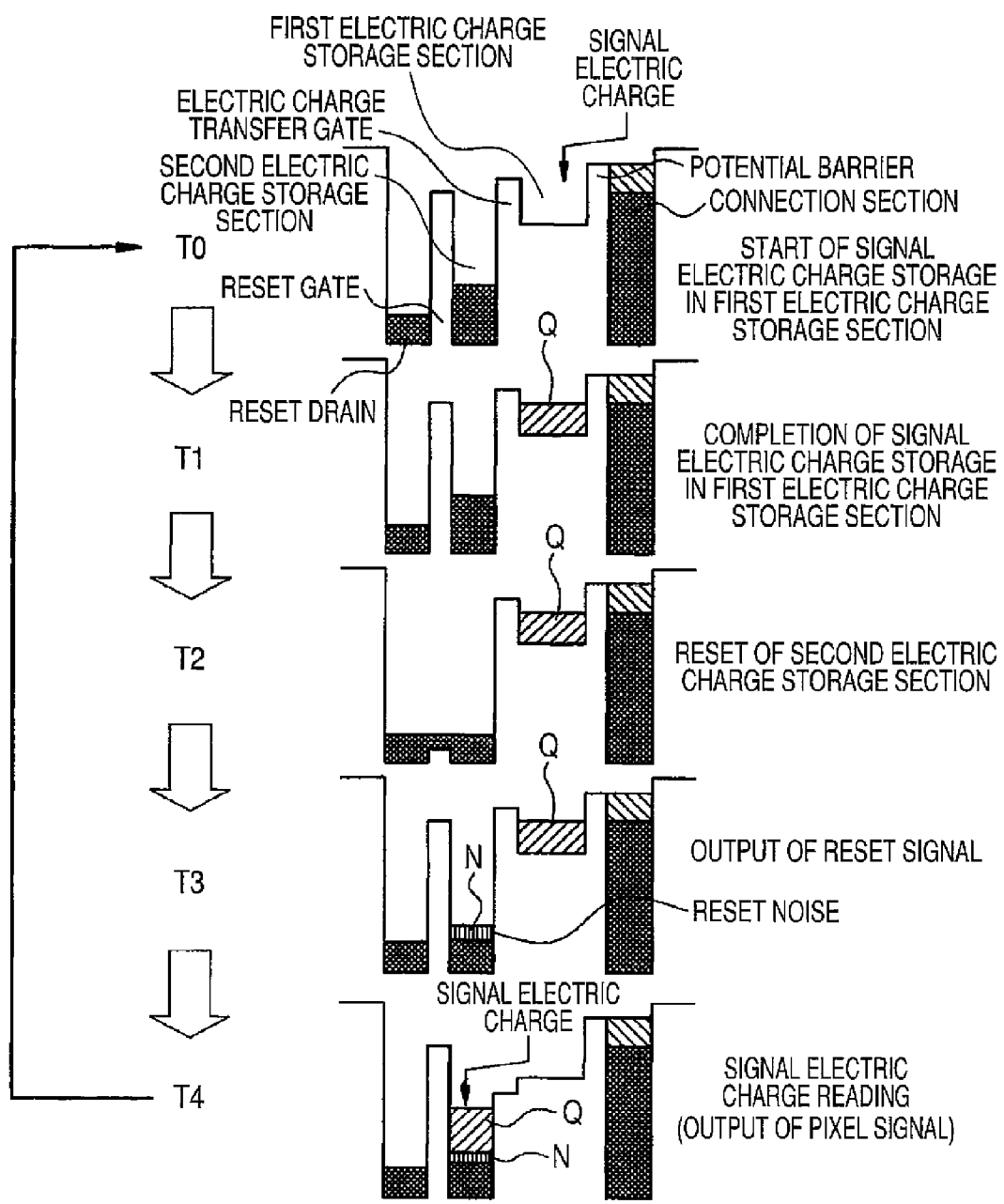
FIG. 4 is a diagram illustrating operations of the solid state imaging device of the first embodiment performed from the start of light exposure to signal reading.

FIG. 4 is a diagram illustrating operations performed from the start of light exposure to signal reading, in which there is shown a cross-sectional potential within the substrate 1 at each time. FIG. 5 is a diagram showing relationships among the voltage change of the first electric charge storage section 4, the voltage change of the second electric charge storage section 5, the reset timing of the reset transistor, and the timing of transfer of the electric charge from the first electric charge storage section 4 to the second electric charge storage section 5.

At a time point when a signal, responsive to the signal electric charge stored in the second electric charge storage section 5 during a certain light exposure period, is outputted, a potential as indicated by a time T0 is provided in the substrate 1. In this state, no electric charge transfer pulse is applied to the electric charge transfer gate 8, and no rest pulse is applied to the reset gate 9. Upon start of the next light exposure period in this state, the signal electric charge generated by the photoelectric conversion layer 15 reaches the connection section 3, and this signal electric charge is stored in the first electric charge storage section 4 via the potential barrier formed by the p-type impurity layer 7b.

When the light exposure period has been ended and the storage of the signal electric charge in the first electric charge storage section 4 has been completed (time T1), a reset pulse is applied to the reset gate 9, and the signal electric charge, stored in the second electric charge storage section 5 and obtained during the previous light exposure period, is discharged to the reset drain 6 (time T2). Upon end of the reset pulse application, the potential enters a state indicated by a time T3, in which only the reset noise N is stored in the second electric charge storage section 5.

Upon completion of the reset operation, an electric charge transfer pulse is applied to the electric charge transfer gate 8, and the signal electric charge Q, stored in the first electric charge storage section 4, is transferred to the second electric charge storage section 5 (time T4). It should be noted that the impurity concentration of the first electric charge storage section 4 is preferably adjusted so that the first electric charge storage section 4 is completely depleted when the electric charge transfer pulse is applied to the electric charge transfer gate 8. After the application of the electric charge transfer pulse has been stopped and the transfer of the signal electric charge Q has been completed, the operation goes back to the time T0, and from then on, the operations from the time T0 to the time T4 are repeated.

As shown in FIG. 5, the CDS circuit 31 performs sampling on signals at a timing (1) at which the reset of the second electric charge storage section 5 is completed, and at a timing (2) at which the electric charge transfer from the first electric charge storage section 4 to the second electric charge storage section 5 is completed, and then subtracts, from an imaging signal including a noise signal subjected to the sampling at the timing (2) and responsive to the reset noise N, the noise signal subjected to the sampling at the timing (1) and responsive to the reset noise N, thereby removing the noise signal from the imaging signal.

Thus, in the solid state imaging device of the present embodiment, the first electric charge storage section 4 for temporarily storing a signal electric charge generated during a light exposure period is provided; therefore, after the second electric charge storage section 5 to which the output transistor 5a is connected has been reset, the electric charge can be transferred to the second electric charge storage section 5 in a period of time sufficiently shorter than the light exposure period. Consequently, even if sampling is performed at a slight time interval between the timing (1) and the timing (2) as shown in FIG. 5, the noise signal resulting from the reset noise included in the imaging signal can be properly removed.

Further, in the solid state imaging device of the present embodiment, the photoelectric conversion element P is provided above the substrate 1 instead of inside the substrate 1, and therefore, a sufficient space for adding the first electric charge storage section 4 can be ensured in the substrate 1. In the case of a common solid state imaging device in which a photodiode is formed in the substrate 1, the addition of the first electric charge storage section 4 in the substrate makes it difficult to maintain a space for the photodiode, and there is a concern that sensitivity is decreased. Furthermore, if the maintenance of the sensitivity is attempted, there is a concern that the number of pixels is decreased or the chip size is increased, for example. However, such concerns will be eliminated in the solid state imaging device of the present embodiment.

<Second Embodiment>

FIG. 6 is a schematic cross-sectional view of a solid state imaging device for one pixel, serving as a second exemplary embodiment of the present invention. In FIG. 6, the same constituent elements as those shown in FIG. 1 are identified with the same reference characters.

The solid state imaging device shown in FIG. 6 is structured so that the p-type impurity layer 7b of the solid state imaging device shown in FIG. 1 is provided under the connection section 3, and furthermore, the first electric charge storage section 4 is provided under the p-type impurity layer 7b.

The electric charge transfer gate 8 shown in FIG. 6 functions similarly to that of the solid state imaging device shown in FIG. 1, and upon application of an electric charge transfer pulse to the electric charge transfer gate 8, the electric charge stored in the first electric charge storage section 4 is transferred to the second electric charge storage section 5.

Thus, even in the structure as shown in FIG. 6, the reset noise can be properly removed. In the structure shown in FIG. 6, a redundant space in the substrate 1 can be expanded, and therefore, the design flexibility of the signal output circuit and the like can be improved.

<Third Embodiment>

FIG. 7 is a schematic cross-sectional view of a solid state imaging device for one pixel, serving as a third exemplary embodiment of the present invention. In FIG. 7, the same constituent elements as those shown in FIG. 1 are identified with the same reference characters.

The solid state imaging device shown in FIG. 7 is structured so that a p-type impurity layer 4a is formed by injecting a p-type impurity, having a conductivity type opposite to that of the first electric charge storage section 4, into a surface of the first electric charge storage section 4 of the solid state imaging device shown in FIG. 1. Since the signal electric charge is stored in the first electric charge storage section 4 for a period of time substantially equal to the light exposure period, the first electric charge storage section 4 is susceptible to a dark current generated at the surface of the substrate 1. Therefore, as shown in FIG. 7, the p-type impurity layer 4a is formed at the surface of the first electric charge storage section 4, thus making it possible to suppress the intrusion of the dark current generated at the substrate surface, and to improve the S/N ratio.

<Fourth Embodiment>

Figure 8:
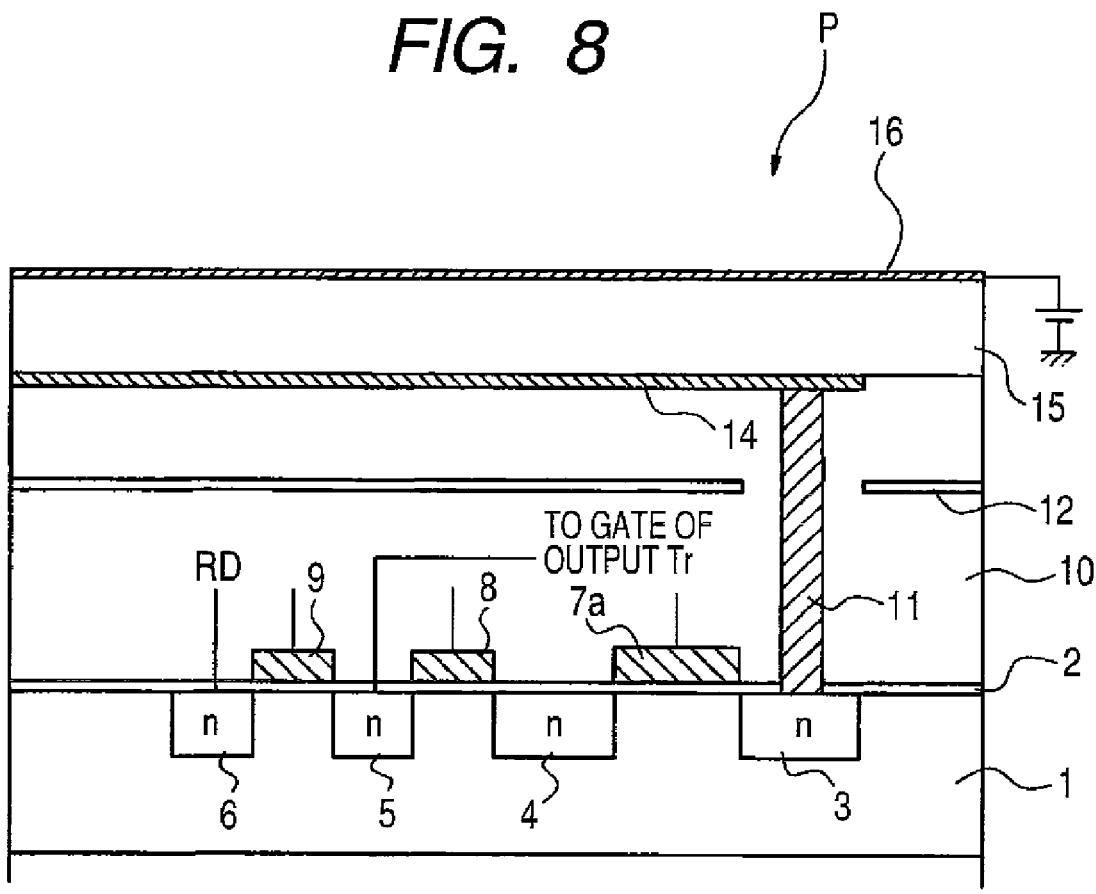
FIG. 8 is a schematic cross-sectional view of a solid state imaging device for one pixel, serving as a fourth exemplary embodiment of the present invention.

FIG. 8 is a schematic cross-sectional view of a solid state imaging device for one pixel, serving as a fourth exemplary embodiment of the present invention. In FIG. 8, the same constituent elements as those shown in FIG. 1 are identified with the same reference characters.

The solid state imaging device shown in FIG. 8 is structured so that a gate electrode 7a is provided instead of the p-type impurity layer 7b functioning as the potential barrier means of the solid state imaging device shown in FIG. 1.

The gate electrode 7a serves as a gate electrode of a transistor whose source is the connection section 3 and whose drain is the first electric charge storage section 4, and is provided above the substrate 1 between the connection section 3 and the first electric charge storage section 4 via the gate insulating film 2.

The size of a potential barrier serving as a potential barrier means can be adjusted with a voltage applied to the gate electrode 7a. For example, if the signal electric charge is an electron, the greater the positive voltage applied to the gate electrode 7a, the smaller the electron barrier for the signal electric charge can be.

Thus, the potential barrier means may be formed by a transistor in this manner.

It should be noted that also in the structure shown in FIG. 8, the improvement of the S/N ratio can be promoted by providing a p-type impurity layer at the surface of the first electric charge storage section 4.

<Fifth Embodiment>

Figure 9:
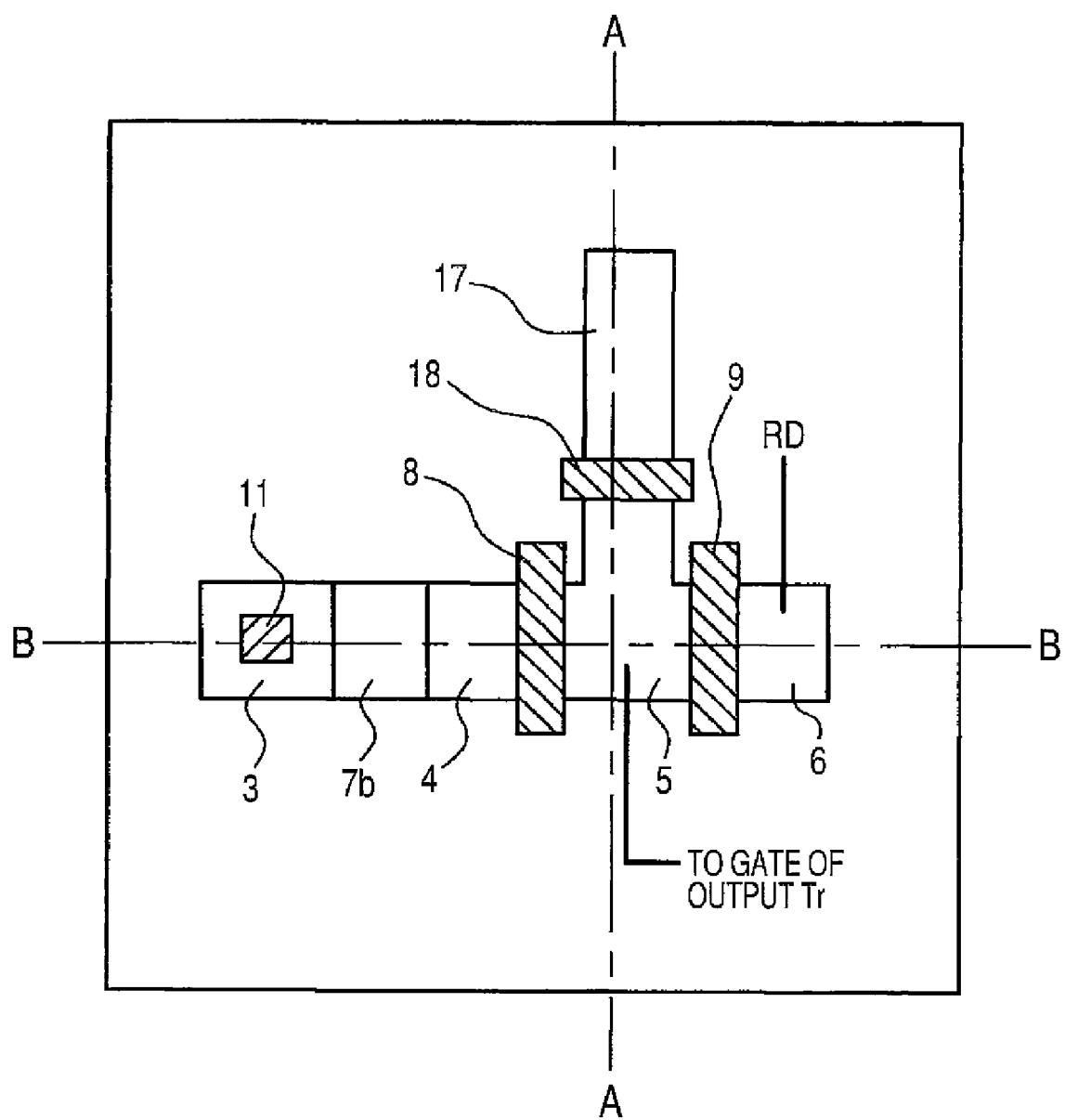
FIG. 9 is a schematic plan view of one pixel of a solid state imaging device serving as a fifth exemplary embodiment of the present invention.

FIG. 9 is a schematic plan view of one pixel of a solid state imaging device serving as a fifth exemplary embodiment of the present invention. In FIG. 9, the same constituent elements as those shown in FIG. 1 are identified with the same reference characters. It should be noted that FIG. 1 is a diagram schematically showing a cross section taken along the line B-B of FIG. 9.

The solid state imaging device shown in FIG. 9 is structured so that a third electric charge storage section 17, formed by an impurity layer having a conductivity type similar to that of the connection section 3, is provided next to the second electric charge storage section 5 of the solid state imaging device shown in FIG. 1 at a slight distance therefrom, and an electrode 18, functioning as a combination control means for performing control so as to combine the storage capacity of the second electric charge storage section 5 with that of the third electric charge storage section 17, is provided above the substrate 1 between the second electric charge storage section 5 and the third electric charge storage section 17.

Upon application of a high-voltage control pulse from the driving section 35 to the electrode 18, the storage capacity of the second electric charge storage section 5 is combined with that of the third electric charge storage section 17, and therefore, the storage capacity of the second electric charge storage section 5 can be increased by the storage capacity of the third electric charge storage section 17 as compared with the case where no control pulse is applied.

In order to improve the S/N ratio, the charge-to-voltage conversion gain of the output transistor 5a has to be increased. For this purpose, the capacity added to the gate of the output transistor 5a has to be reduced. Since this capacity includes the storage capacity of the second electric charge storage section 5, the storage capacity of the second electric charge storage section 5 needs to be reduced in order to improve the charge-to-voltage conversion gain. However, if the storage capacity of the second electric charge storage section 5 is reduced, there occurs a problem that the saturation signal amount is decreased.

Therefore, in the present embodiment, in order to avoid this trade-off relationship, the storage capacity of the second electric charge storage section 5 is reduced in advance, and if the amount of signal electric charges generated by the photoelectric conversion layer 15 is small, no control pulse is applied to the electrode 18 so that the gate capacity of the output transistor 5a is reduced and the charge-to-voltage conversion gain is increased, thereby promoting the improvement of the S/N ratio. On the other hand, if the amount of signal electric charges is large, all the signal electric charges cannot be stored in the second electric charge storage section 5, and therefore, a control pulse is applied to the electrode 18, thereby allowing part of the signal electric charges to be stored in the third electric charge storage section 17.

Specifically, the system control section 36 shown in FIG. 3 determines the amount of signal electric charges generated by the photoelectric conversion layer 15, and instructs the driving section 35 not to apply a control pulse to the electrode 18 when the signal electric charge amount is equal to or less than a threshold value Th, but instructs the driving section 35 to apply a control pulse to the electrode 18 when the signal electric charge amount exceeds the threshold value Th. The driving section 35 performs ON/OFF control of a control pulse in accordance with an instruction provided from the system control section 36. The determination of the signal electric charge amount can be performed based on an imaging signal obtained from the solid state imaging device 30 during pre-imaging, which is performed before actual imaging in order to carry out automatic exposure (AE) or autofocusing (AF), for example.

Hereinafter, how the imaging apparatus having the solid state imaging device shown in FIG. 9 operates during shooting will be described.

Figure 10:
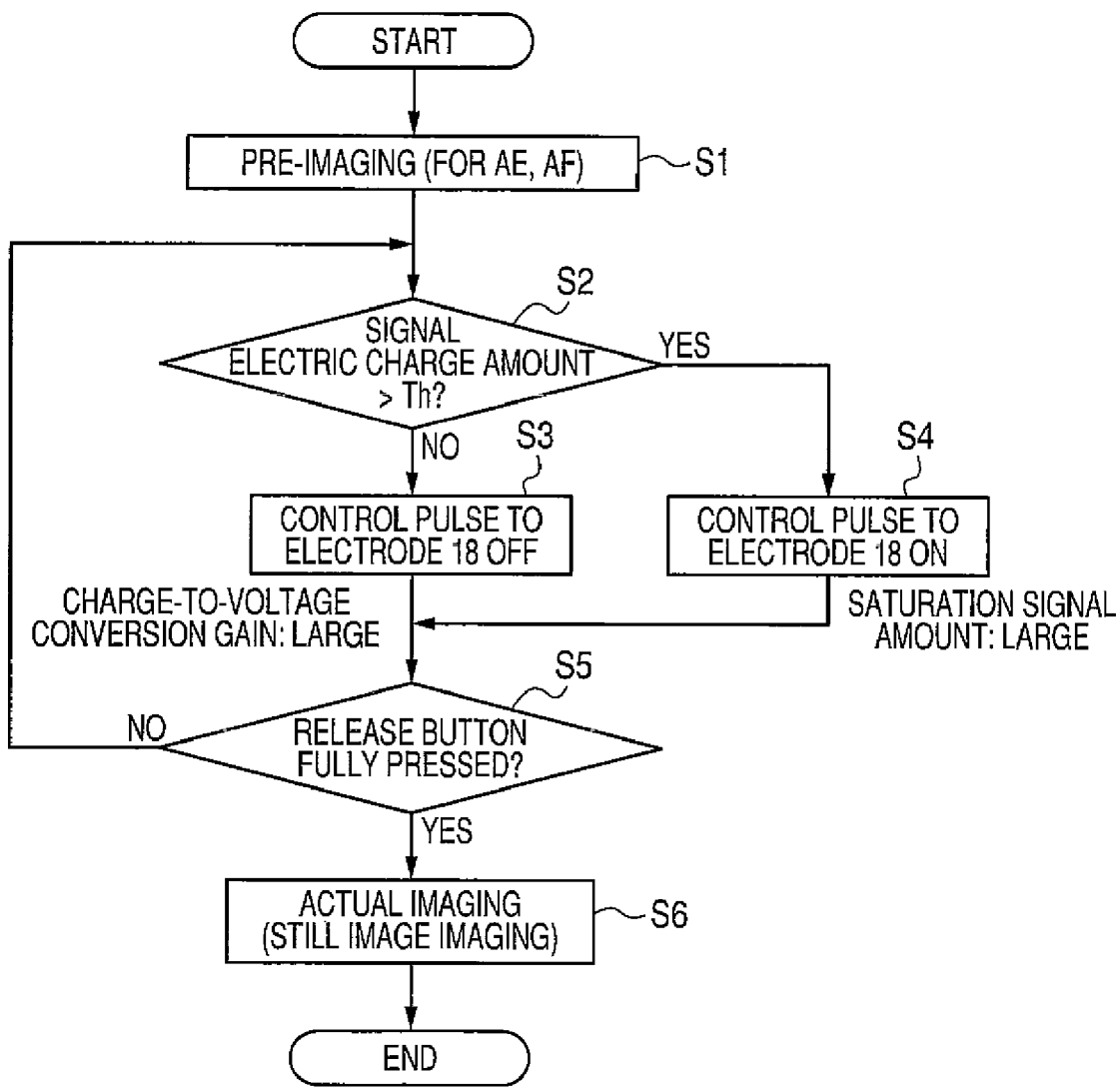
FIG. 10 is a flow chart for describing how the imaging apparatus having the solid state imaging device shown in FIG. 9 operates during a still image shooting mode.

FIG. 10 is a flow chart for describing how the imaging apparatus having the solid state imaging device shown in FIG. 9 operates during a still image shooting mode.

When the still image shooting mode is set and a release button is pressed halfway down, pre-imaging is performed by the solid state imaging device 30 (Step S1). The system control section 36 acquires imaging signals outputted from the solid state imaging device 30 due to the pre-imaging, determines an average of the imaging signals obtained from all pixels of the solid state imaging device 30, and determines the amount of signal electric charges generated by each photoelectric conversion layer 15 due to this pre-imaging based on this average value and a table stored in advance (i.e., a table in which a relationship between the average of imaging signals of all pixels and the amount of signal electric charges generated by the photoelectric conversion layer 15 is registered), thereby determining whether or not this signal electric charge amount is equal to or less than the threshold value Th (Step S2). This threshold value Th is defined as a value equal to the storage capacity of the second electric charge storage section 5, for example.

If the signal electric charge amount is equal to or less than the threshold value, the signal electric charges generated by the photoelectric conversion layer 15 can be entirely stored in the second electric charge storage section 5. Therefore, no control pulse is applied to the electrode 18 (Step S3). On the other hand, if the signal electric charge amount exceeds the threshold value Th, the signal electric charges generated by the photoelectric conversion layer 15 cannot be entirely stored in the second electric charge storage section 5. Therefore, a control pulse is applied to the electrode 18 (Step S4).

After Step S3 or Step S4, when the release button is fully pressed to provide an instruction for actual imaging (when the answer is YES in Step S5), the actual imaging is performed by the solid state imaging device 30 in accordance with this instruction, image data generated by the actual imaging is recorded on the recording medium 34, and then the shooting ends. If an instruction for actual imaging is not provided (when the answer is NO in Step S5), the process goes to Step S2.

By performing such control, a large saturation electric charge amount can be ensured when the object is bright, and the charge-to-voltage conversion gain can be increased to improve the S/N ratio when the signal electric charge amount is small. If a control pulse is applied to store the signal electric charges in the third electric charge storage section 17, the storage capacity of the third electric charge storage section 17 is added to the gate capacity of the output transistor 5a. Therefore, the charge-to-voltage conversion gain is reduced; however, if the signal electric charge amount is large, the sufficient S/N ratio is ensured since the signal amount is primarily large, and the influence of the S/N ratio degradation affected by this charge-to-voltage conversion gain reduction is small.

It should be noted that the potential with respect to the signal electric charge of the third electric charge storage section 17 is preferably set to be larger than the potential with respect to the signal electric charge of the second electric charge storage section 5 (by impurity concentration setting) to provide a structure which facilitates the flow of the signal electric charge from the third electric charge storage section 17 to the second electric charge storage section 5 when the signal electric charge is reset by the rest transistor. Further, this potential with respect to the signal electric charge may be inclined by impurity concentration adjustment so as to facilitate the flow of the signal electric charge toward the reset drain 6 inside the second electric charge storage section 5 and the third electric charge storage section 17.

Furthermore, if the above-described control is performed, the total capacity of the storage capacity of the second electric charge storage section 5 and the storage capacity of the third electric charge storage section 17 has to be equal to or more than the storage capacity of the first electric charge storage section 4. Moreover, the storage capacity of the second electric charge storage section 5 is preferably smaller than that of the first electric charge storage section 4 in order to maximize the conversion gain of the output transistor 5a when no control pulse is applied to the electrode 18.

Figure 11:
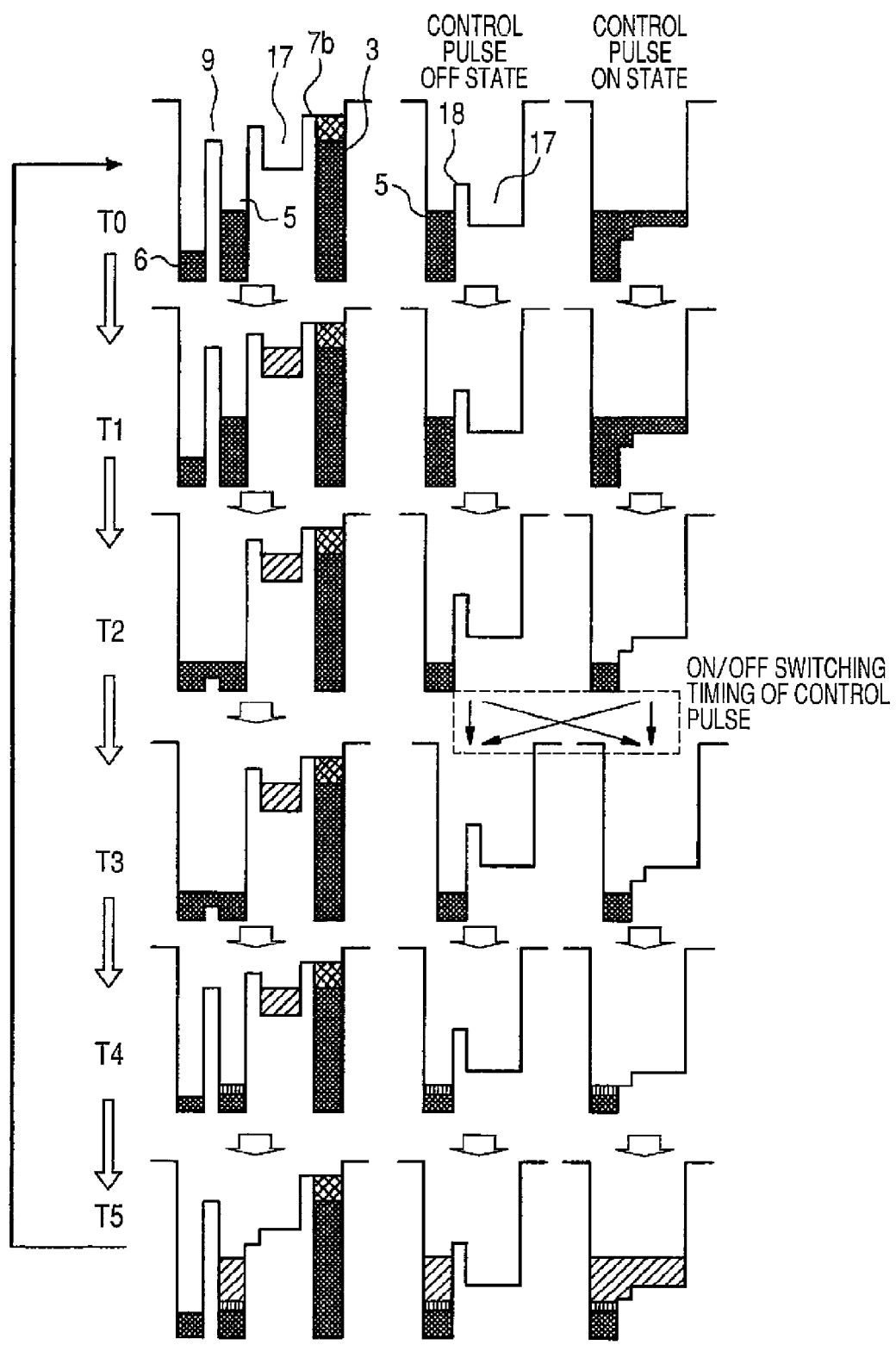
FIG. 11 is a diagram for describing an electric charge storage operation performed by the solid state imaging device shown in FIG. 9.
Figure 12:
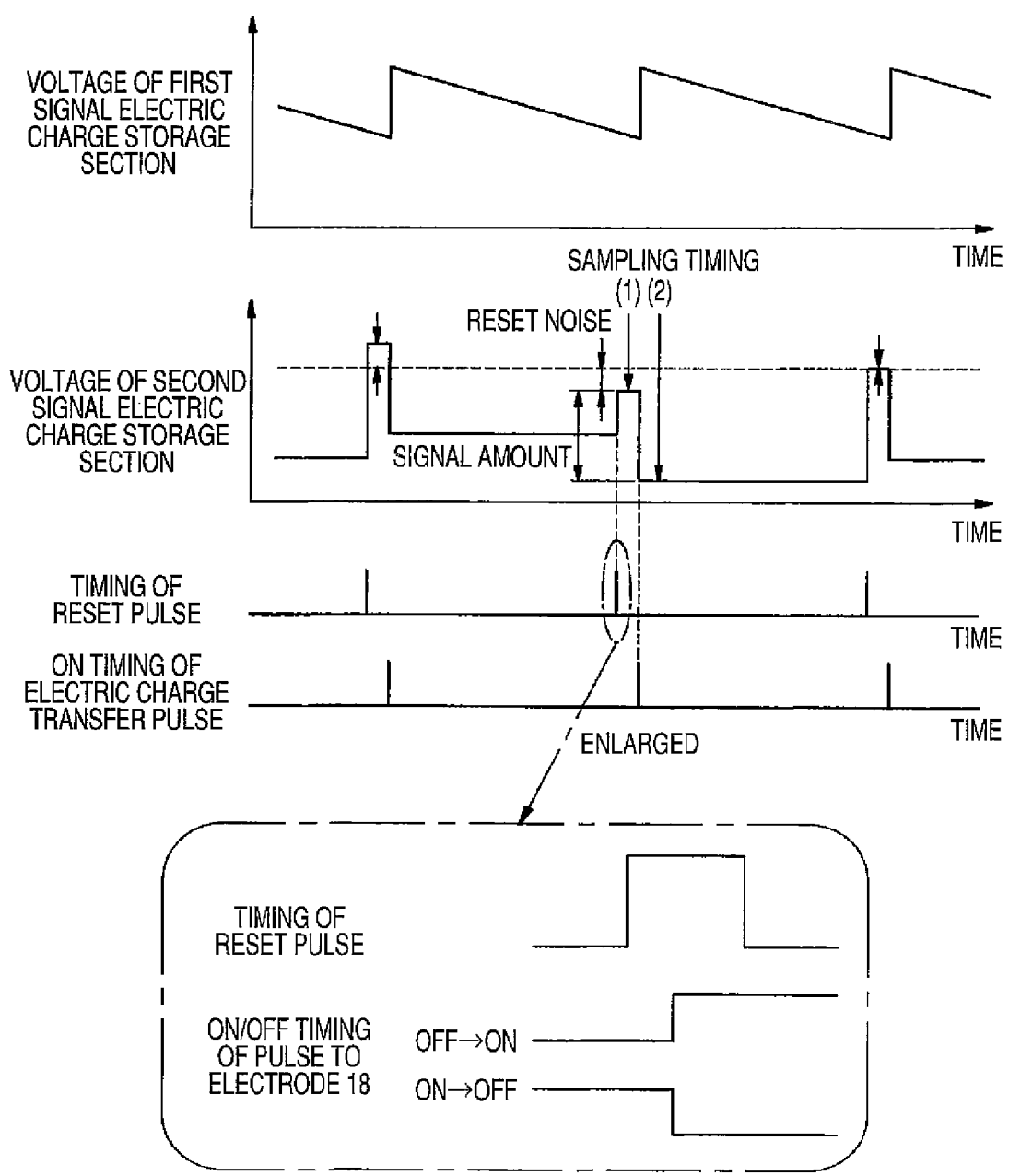
FIG. 12 is a diagram for describing the electric charge storage operation performed by the solid state imaging device shown in FIG. 9.

FIGS. 11 and 12 are diagrams for describing an electric charge storage operation performed by the solid state imaging device shown in FIG. 9.

As shown in FIGS. 11 and 12, during a period in which reset is performed at a time T3, the ON/OFF of a control pulse to the electrode 18 is switched, thus allowing all the signal electric charges, stored in the first electric charge storage section 4, to be entirely stored in the second electric charge storage section 5.

It should be noted that the above description has been made on the structure in which the third electric charge storage section 17 and the electrode 18 are added to the solid state imaging device shown in FIG. 1; however, the third electric charge storage section 17 and the electrode 18 may be added to the solid state imaging device having the structure shown in FIG. 6.

Figure 13:
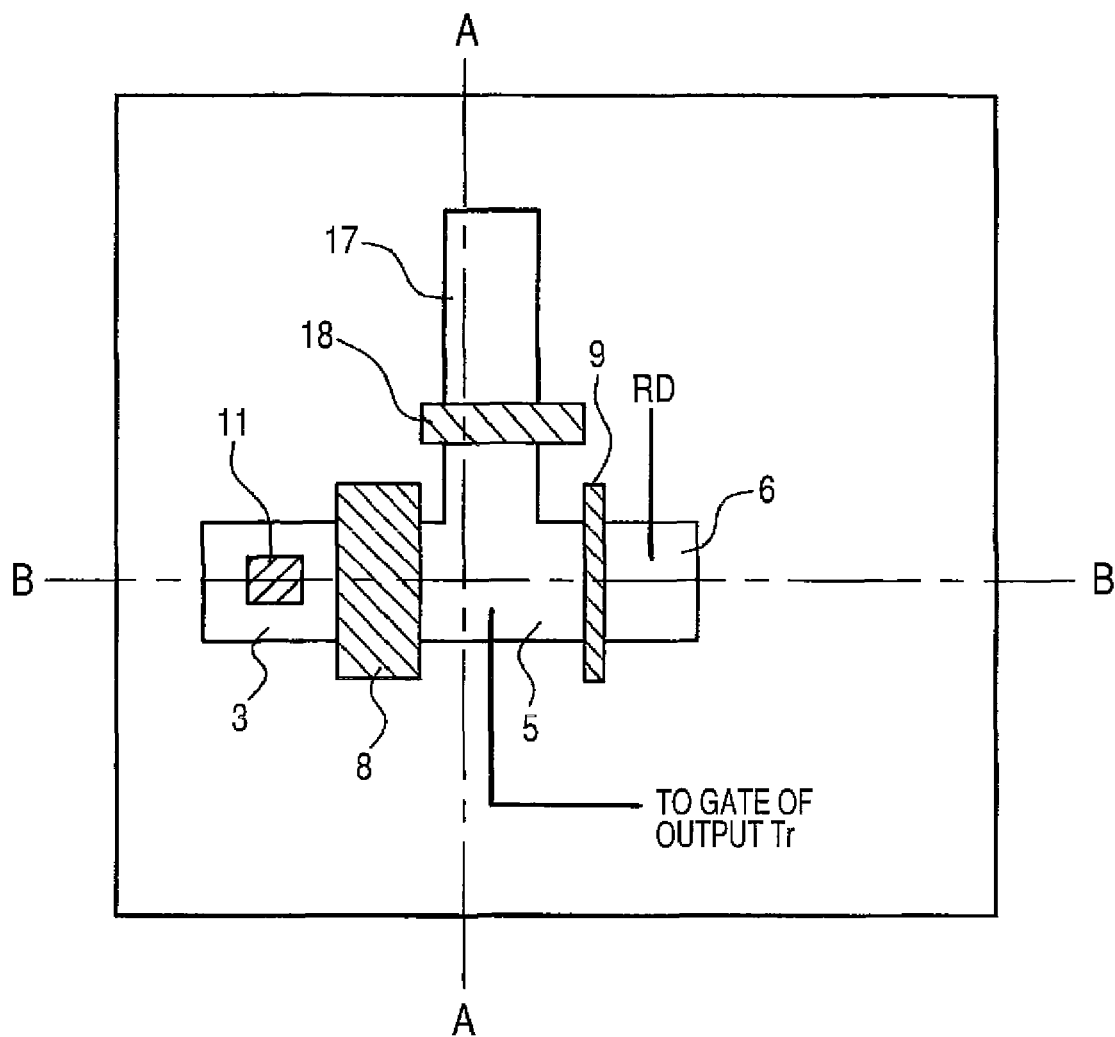
FIG. 13 is a schematic plan view of one pixel of the solid state imaging device serving as the fifth embodiment of the present invention.

In this case, as shown in FIG. 13, the solid state imaging device may be structured so that the third electric charge storage section 17, formed by an impurity layer having a conductivity type similar to that of the connection section 3, is provided next to the second electric charge storage section 5 of the solid state imaging device shown in FIG. 6, and an electrode 18, functioning as a combination control means for performing control so as to combine the storage capacity of the second electric charge storage section 5 with that of the third electric charge storage section 17, is provided above the substrate 1 between the second electric charge storage section 5 and the third electric charge storage section 17. Even in such a structure, the effect of improving the S/N ratio described above can be obtained. It should be noted that FIG. 6 is a diagram schematically showing a cross section taken along the line B-B of FIG. 13.

<Sixth Embodiment>

Figure 14:
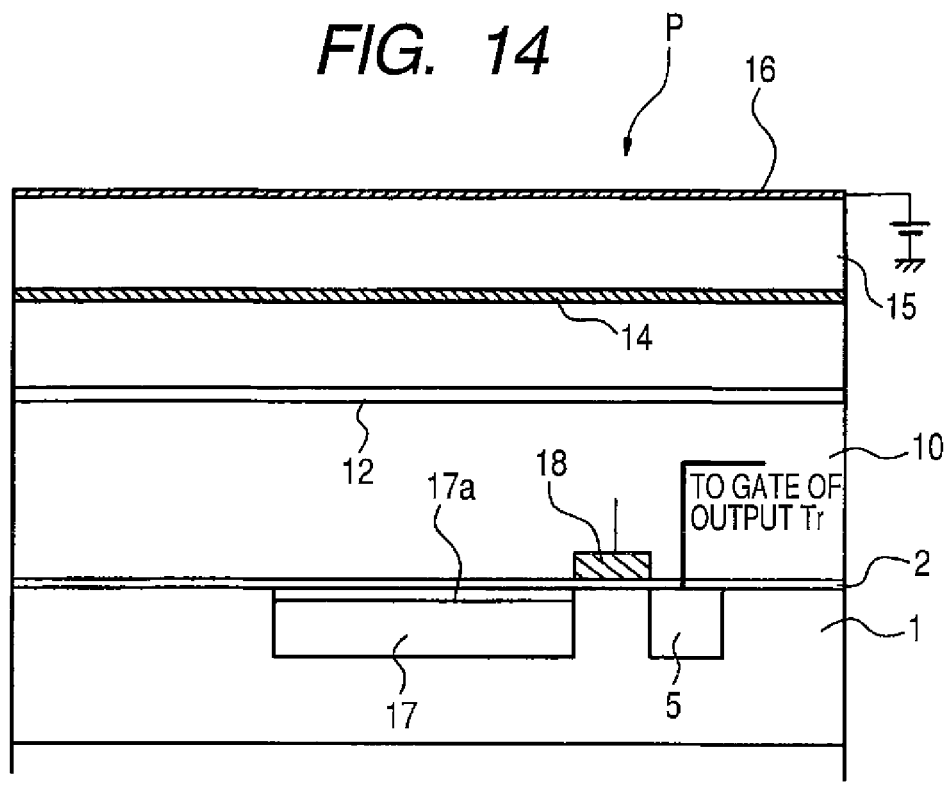
FIG. 14 is a schematic cross-sectional view of one pixel of a solid state imaging device serving as a sixth exemplary embodiment of the present invention.

FIG. 14 is a schematic cross-sectional view of one pixel of a solid state imaging device serving as a sixth exemplary embodiment of the present invention. In FIG. 14, the same constituent elements as those shown in FIGS. 9 and 13 are identified with the same reference characters. It should be noted that FIG. 14 is a diagram schematically showing a cross section taken along the line A-A of FIG. 9 or FIG. 13.

The solid state imaging device shown in FIG. 14 is structured so that a p-type impurity layer 17a, having a conductivity type opposite to that of the third electric charge storage section 17, is provided at a surface of the third electric charge storage section 17 of the solid state imaging device shown in FIG. 9 or FIG. 13. Due to such a structure, the dark current generated at the surface of the third electric charge storage section 17 can be suppressed, and the S/N ratio can be further improved.

<Seventh Embodiment>

Figure 15:
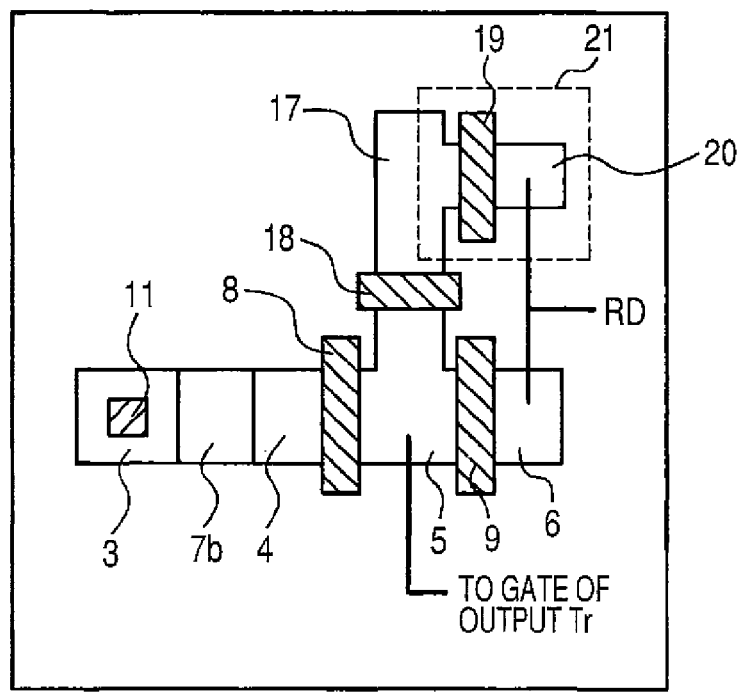
FIG. 15 is a schematic diagram of a surface of one pixel of a solid state imaging device serving as a seventh exemplary embodiment of the present invention.

FIG. 15 is a schematic diagram of a surface of one pixel of a solid state imaging device serving as a seventh exemplary embodiment of the present invention. In FIG. 15, the same constituent elements as those shown in FIG. 9 are identified with the same reference characters.

The solid state imaging device shown in FIG. 15 is structured so that a reset transistor 21 for resetting the electric charge stored in the third electric charge storage section 17 is added to the solid state imaging device shown in FIG. 9.

As shown in FIG. 15, a reset drain 20, formed by an n-type impurity layer having a conductivity type similar to that of the connection section 3, is provided next to the third electric charge storage section 17 at a slight distance therefrom. Above the substrate 1 between the third electric charge storage section 17 and the reset drain 20, a gate electrode 19 of the reset transistor 21, whose source is the third electric charge storage section 17 and whose drain is the reset drain 20, is provided via the gate insulating film 2. Upon application of a high-voltage reset pulse to the gate electrode 19, the electric charge stored in the third electric charge storage section 17 is discharged to the reset drain 20. It should be noted that commonality of the gate electrode 19 and the reset gate 9 may be provided.

Thus, in addition to the reset transistor for resetting the second electric charge storage section 5, the reset transistor 21 for resetting the third electric charge storage section 17 is provided, thereby making it possible to reduce the time required for the reset of the signal electric charges stored in the second electric charge storage section 5 and the third electric charge storage section 17.

Although the above description has been made on the structure in which the reset transistor 21 is added to the solid state imaging device shown in FIG. 9, the reset transistor 21 may be added to the solid state imaging device having the structure shown in FIG. 13.

Figure 16:
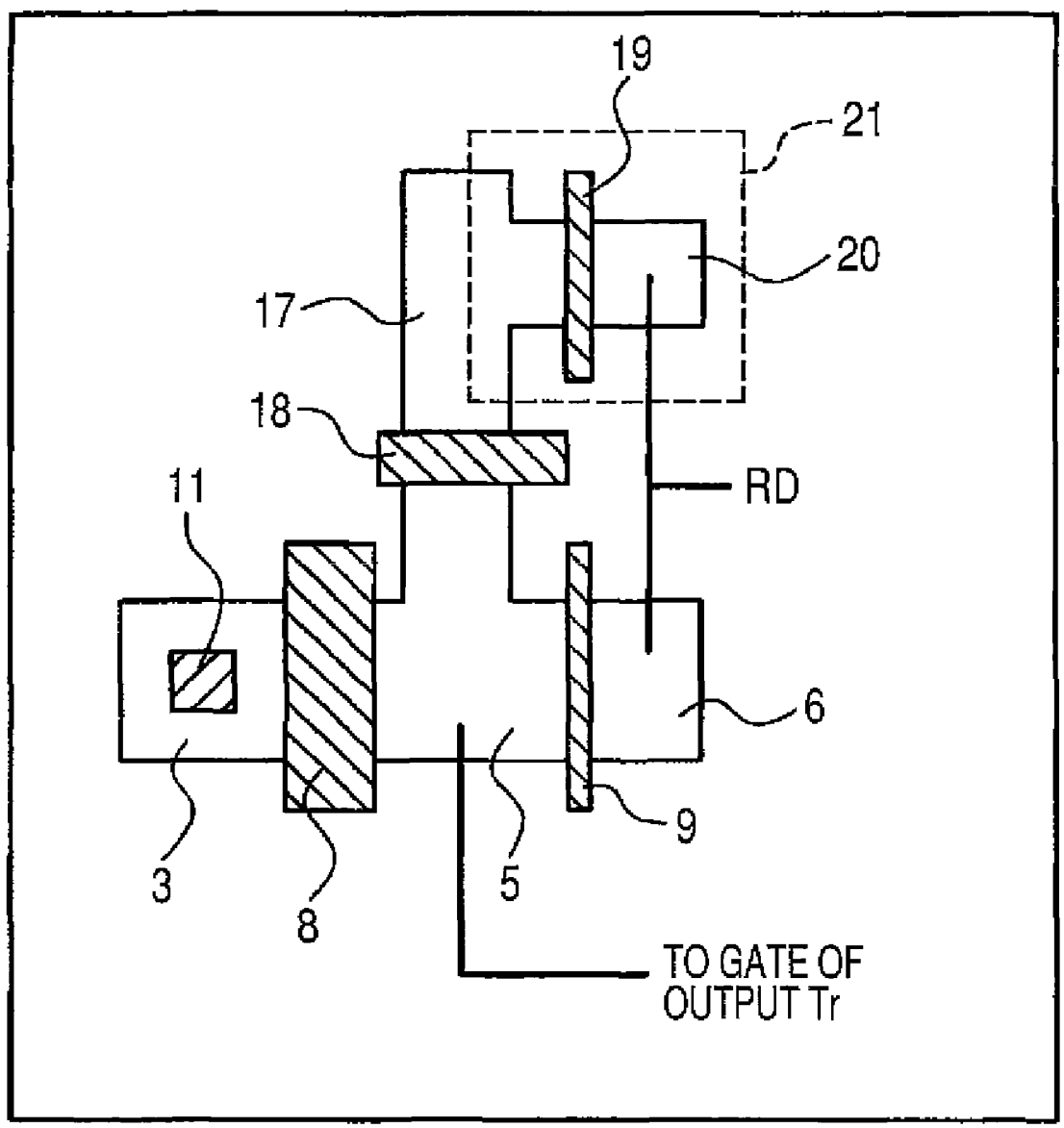
FIG. 16 is a schematic diagram of a surface of one pixel of a solid state imaging device serving as the seventh embodiment of the present invention.
Figure 17:
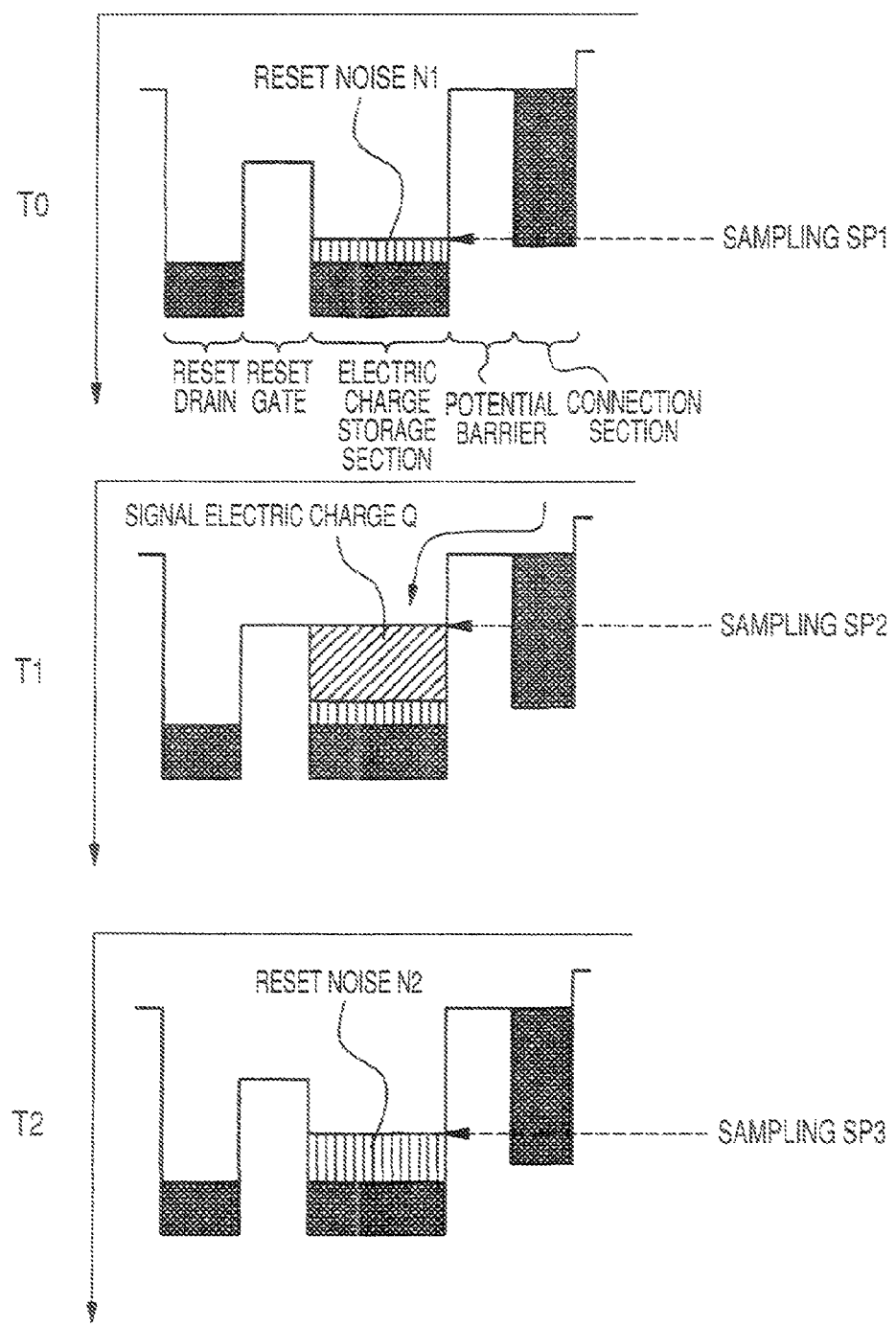
FIG. 17 is a diagram for describing how a solid state imaging device disclosed in JP-A-2005-268477 operates.

In this case, as shown in FIG. 16, the solid state imaging device may be structured so that the reset drain 20, formed by an n-type impurity layer having a conductivity type similar to that of the connection section 3, is provided next to the third electric charge storage section 17 of the solid state imaging device shown in FIG. 13, and the gate electrode 19 is provided above the substrate 1 between the third electric charge storage section 17 and the reset drain 20.

It should be noted that the first to seventh embodiments have been described based on the assumption that the signal electric charge stored in the first electric charge storage section 4 is an electron, but if this signal electric charge is a positive hole, all the impurity layers shown in each diagram have opposite conductivity types.

What is claimed is:

1. A solid state imaging device comprising:
    a semiconductor substrate
    a photoelectric conversion element including a pair of electrodes and a photoelectric conversion layer sandwiched between the pair of electrodes;
    a signal output circuit including a MOS transistor for outputting a signal responsive to an electric charge generated by the photoelectric conversion layer;
    a connection section provided in the semiconductor substrate and electrically connected to one of the pair of electrodes;
    a potential barrier section adjacent to the connection section and serving as a constant potential barrier for the connection section;
    a first electric charge storage section which is provided in the semiconductor substrate and in which the electric charge generated by the photoelectric conversion layer is directly stored and which is adjacent to the potential barrier section;
    a second electric charge storage section provided in the semiconductor substrate and directly connected to a gate of an output transistor in the signal output circuit;
    an electric charge transfer section that transfers the electric charge, stored in the first electric charge storage section, to the second electric charge storage section, wherein the connection section, the potential barrier section, the first electric charge storage section, the electric charge transfer section, and the second electric charge storage section are arranged in this order;
    and a reset transistor directly connected to said second electric charge storage section.

2. The solid state imaging device according to claim 1, wherein the potential barrier section is an impurity layer having a conductivity opposite to those of the connection section, the first electric charge storage section, and the second electric charge storage section.

3. The solid state imaging device according to claim 1, wherein the electric charge transfer section is a gate electrode of a transistor whose source is the first electric charge storage section and whose drain is the second electric charge storage section.

4. An imaging apparatus comprising a solid state imaging device according to claim 1,
    wherein the signal output circuit of the solid state imaging device includes a reset transistor for resetting an electric charge of the second electric charge storage section, and
    wherein the imaging apparatus comprises:
    a driving section that performs, after the electric charge of the second electric charge storage section is reset by the reset transistor, driving so as to transfer the electric charge stored in the first electric charge storage section to the second electric charge storage section that has been reset; and
    a signal processing section that performs sampling on a noise signal responsive to a noise electric charge stored in the second electric charge storage section by the reset, and on an imaging signal responsive to the electric charge transferred to the second electric charge storage section after the reset, and that determines a difference between both the signals, so as to perform a correlated double sampling process for removing the noise signal from the imaging signal.

5. The solid state imaging device according to claim 1, wherein the reset transistor includes a reset drain and reset gate electrode, the reset gate electrode connected to said second electric charge storage section such that said second electric charge storage section is the source for said reset transistor.

* * * * *